(12) United States Patent
Elmala et al.

(10) Patent No.: US 7,414,478 B2
(45) Date of Patent: Aug. 19, 2008

(54) INTEGRATED PARALLEL POWER AMPLIFIER

(75) Inventors: Mostafa Elmala, Tigard, OR (US); Jeyanandh K Paramesh, Seattle, OR (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 11/395,536

(22) Filed: Mar. 31, 2006

(65) Prior Publication Data

US 2007/0229165 A1    Oct. 4, 2007

(51) Int. Cl.
    H03F 3/68    (2006.01)
(52) U.S. Cl. .................................................. 330/295
(58) Field of Classification Search .................. None
    See application file for complete search history.

(56) References Cited

U.S. PATENT DOCUMENTS

| | | | | |
|---|---|---|---|---|
| 4,305,043 A * | 12/1981 | Ho et al. ...................... 330/53 |
| 6,262,629 B1 * | 7/2001 | Stengel et al. .......... 330/124 R |
| 6,737,948 B2 * | 5/2004 | Aoki et al. .................. 336/200 |
| 6,806,789 B2 * | 10/2004 | Bawell et al. ............... 333/117 |
| 6,816,012 B2 * | 11/2004 | Aoki et al. .................. 330/276 |
| 6,937,615 B1 * | 8/2005 | Lazzarotto et al. ......... 370/465 |
| 6,940,386 B2 * | 9/2005 | Mukherjee et al. ......... 336/200 |
| 7,075,371 B2 * | 7/2006 | Aoki et al. .................. 330/276 |
| 7,180,372 B2 * | 2/2007 | Proehl ........................ 330/295 |
| 7,242,245 B2 * | 7/2007 | Burns et al. ............. 330/124 R |
| 7,248,109 B2 * | 7/2007 | Burns et al. ............. 330/124 R |
| 7,256,573 B2 * | 8/2007 | Magoon et al. ............... 324/95 |
| 7,268,616 B2 * | 9/2007 | Burns et al. ............. 330/124 R |
| 7,301,395 B2 * | 11/2007 | Mobbs .................... 330/124 R |
| 7,304,537 B2 * | 12/2007 | Kwon et al. ............. 330/124 R |
| 2005/0264364 A1 * | 12/2005 | Selin ........................ 330/295 |
| 2007/0115086 A1 * | 5/2007 | Cairo Molins .............. 336/200 |

OTHER PUBLICATIONS

Aoki, Ichiro et al.; A 2.4 GHz, 2.2 W, 2 V Fully Integrated CMOS Circular Geometry Active Transformer Power Amplifier; Department of Electrical Engineering, California Institute of Technology.*
Aoki, Ichiro, et al., "A Fully-Integrated 1.8-V, 2.8-W, 1.9-GHz, CMOS Power Amplifier", *IEEE MTT-S Digest; Department of Electrical Engineering, CA Institute of Technology*, Passadena, CA 91125, (2003), 199-202 pgs.
Aoki, Ichiro, et al., "Fully Integrated CMOS Power Amplifier Design Using the Distributed Active-Transformer Architecture", *IEEE Journaql of Solid-State Circuits*, vol. 37, No. 3, (Mar. 2002), 371-383 pgs.
Kang, Jongchan, et al., "A Sigle-Chip Linear CMOS Power Amplifier for 2.4 GHz WLAN", *ISSC 2006/Session 11/RF Building Blocks and PLLS/11.9, IEEE International Solid-State Circuits Conference*, 3 pgs.

* cited by examiner

*Primary Examiner*—Robert J. Pascal
*Assistant Examiner*—Krista M Flanagan
(74) *Attorney, Agent, or Firm*—Dana B. Lemoine; Lemoine Patent Services, PLLC

(57) ABSTRACT

A parallel power amplifier includes a carrier amplifier and peak amplifier coupled to receive signals from a quadrature hybrid made up of slab inductors in an integrated circuit. The slab inductors may be on different layers in the integrated circuit and may have similar or dissimilar shapes.

18 Claims, 8 Drawing Sheets

INTEGRATED PARALLEL POWER AMPLIFIER

FIELD

The present invention relates generally to amplifier circuits, and more specifically to parallel amplifier circuits.

BACKGROUND

Power amplifiers are a main building block of any transmitter chain. The problems associated with designing power amplifiers are various. These problems include: break down voltages of different transistors, hot carrier effects, losses of choke inductors and matching components, distortions, trade-offs between efficiency and linearity of the amplifier, etc.

DESCRIPTION OF EMBODIMENTS

Figure 1:
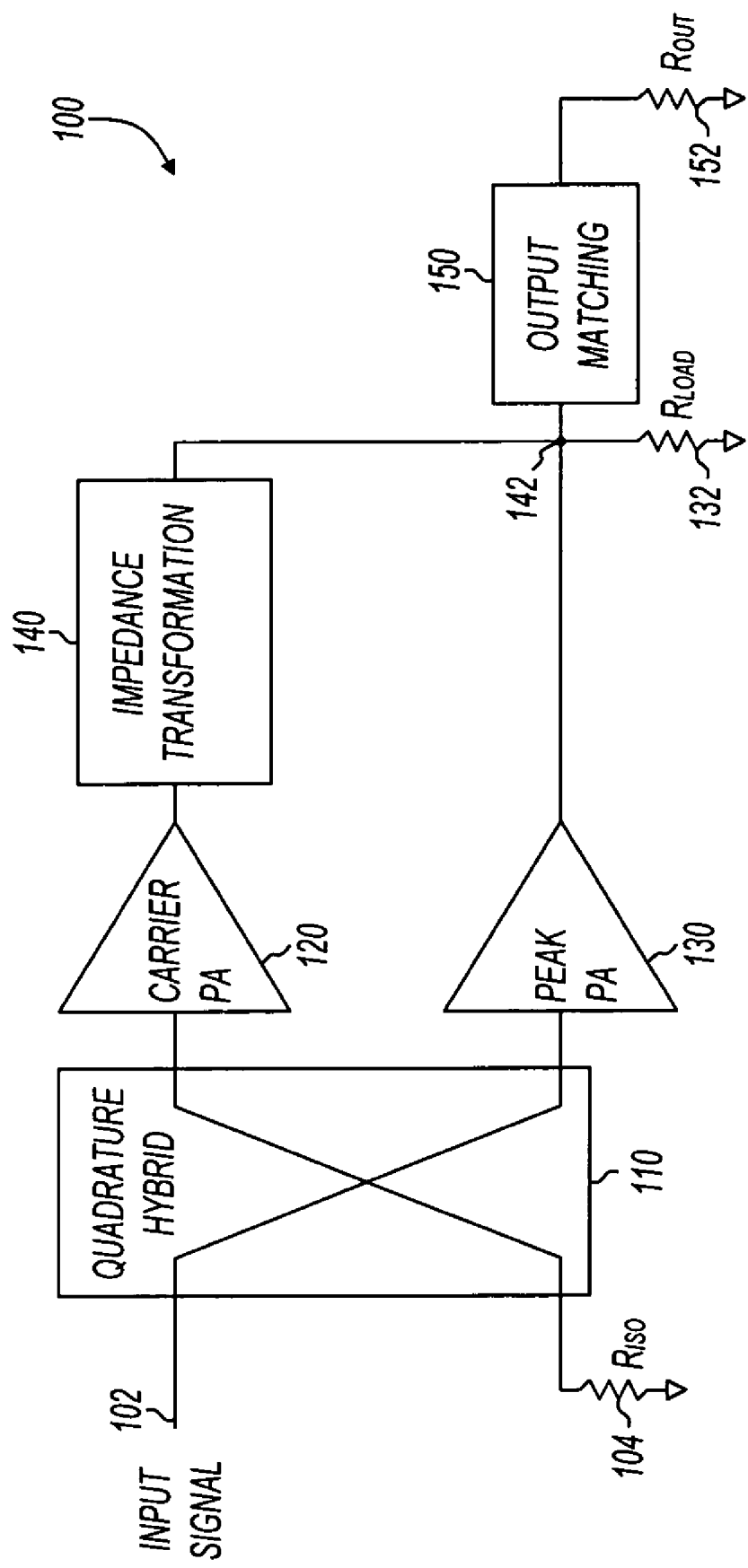
FIG. 1 shows a diagram of a parallel power amplifier circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a parallel power amplifier circuit. Parallel power amplifier circuit 100 includes quadrature hybrid 110, power amplifiers (PA) 120 and 130, impedance transformation circuit 140, and output matching circuit 150. Parallel power amplifier circuit 100 is also shown with resistors 104, 132, and 152.

Parallel power amplifier circuit 100 is an implementation of a high efficiency power amplifier using two separate power amplifiers working in different classes, such as class B and C. Power amplifier 120 operates as a "carrier PA," operating over all input power range, e.g., in class A/B, and power amplifier 130 operates as a "peak PA," operating in class C. In some embodiments, peak PA 130 contributes to the output power only over the upper input power range. For example, peak PA 130 may only contributes to the output power over the upper 6 dB of input power range. Also for example, in some embodiments of the present invention, parallel power amplifier circuit 100 may operate as a "Doherty" power amplifier. Doherty amplifiers are known amplifiers that may include multiple power amplifiers operating in different classes to achieve high efficiency across the upper range of output power.

Quadrature hybrid 110 operates as a coupler to couple the input signal on node 102 to peak PA 130 and carrier PA 120 with a relative phase difference of substantially 90 degrees. For example, the input signal arriving at peak PA 130 may have a phase shift of substantially 90 degrees relative to the input signal arriving at carrier PA 120. Impedance transformation circuit 140 also contributes substantially 90 degrees of phase shift. This phase shift is applied to the carrier amplifier output signal, such that output currents from impedance transformation circuit 140 and peak PA 130 are added in-phase at node 142. Output matching circuit 150 provides an impedance match between node 142 and any load impedance, shown schematically by resistor 152.

In various embodiments of the present invention, power amplifier circuit 100 is integrated onto a single integrated die. In these embodiments, quadrature hybrid 110 may include slab inductors. A "slab inductor" is an inductor manufactured within an integrated circuit and made from non-coiled wires, traces, or conductive regions. For example, a slab inductor may be formed by one or more traces on a metal layer within the integrated circuit. Slab inductors may also be included within carrier PA 120, peak PA 130, impedance transformation circuit 140, and output matching circuit 150. Various embodiments that include slab inductors are described further below with reference to later figures.

Various embodiments of the present invention reduce amplitude-to-phase (AM-to-PM) distortion in parallel power amplifiers by controlling the input capacitance of carrier amplifier 120 and peak amplifier 130. For example, bias points for the power amplifiers may be chosen to modify input capacitance. Also for example, transistor sizes may be specified to control input capacitance. As described further below, input capacitance may be controlled for a first power amplifier can be chosen so that the power amplifier has a phase characteristic that changes in a first direction with increasing input power, and input capacitance for a second power amplifier can be chosen so that the power amplifier has a phase characteristic that changes in a direction opposite the first direction with increasing input power. When output power from both power amplifiers is combined, the phase characteristics combine to reduce phase variation with increasing input power.

Figure 2:
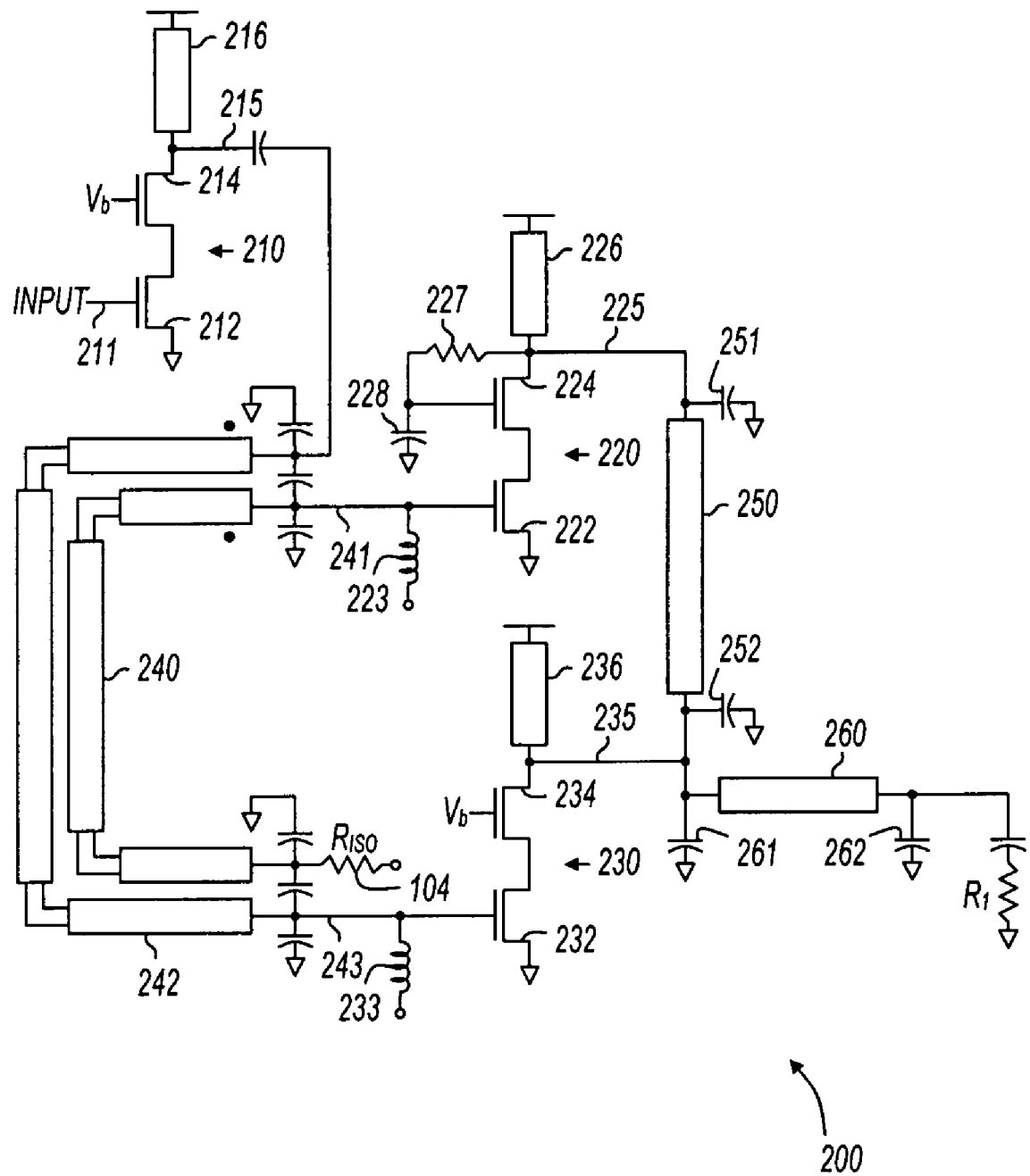
FIG. 2 shows a parallel power amplifier circuit with slab inductors in accordance with various embodiments of the present invention.

FIG. 2 shows a parallel power amplifier circuit with slab inductors in accordance with various embodiments of the present invention. Parallel power amplifier circuit 200 is shown as one side of a differential system. Parallel power amplifier circuit 200 includes driver amplifier 210, carrier amplifier 220, and peak amplifier 230. Parallel power amplifier 200 also includes slab inductors 240, 242, 216, 226, 236, 250, and 260.

Slab inductors 240 and 242 form a quadrature hybrid, such as quadrature hybrid 110 (FIG. 1). In some embodiments, slab inductors 240 and 242 are manufactured on a common layer in an integrated circuit. For example, slab inductors 240 and 242 may be located side-by-side on a common integrated circuit layer to achieve inductive coupling. In other embodiments, slab inductors 240 and 242 are manufactured on separate layers in an integrated circuit. For example, slab inductors 240 and 242 may be located with one on top of the other to achieve inductive coupling. Further, in some embodiments, one or both of slab inductors 240 and 242 may be distributed across more than one integrated circuit layer. For example, slab inductor 240 may be manufactured on one metal layer of an integrated circuit, and slab inductor 242 may be manufactured on multiple layers of the integrated circuit.

In some embodiments, slab inductors 240 and 242 may have similar shapes. For example, in some embodiments, slab inductors 240 and 242 may be located side-by-side with similar shapes on a common integrated circuit layer. Also for example, in some embodiments, slab inductors 240 and 242 may have similar shapes, and may be located with one on top of the other on separate integrated circuit layers. Further, in some embodiments, slab inductors 240 and 242 may have dissimilar shapes. For example, in some embodiments, slab inductors 240 and 242 may be located side-by-side with dissimilar shapes on a common integrated circuit layer. Also for example, in some embodiments, slab inductors 240 and 242 may have dissimilar shapes, and may be located with one on top of the other on separate integrated circuit layers. Various shape/layer combinations for slab inductors are described further below with reference to later figures.

Driver amplifier 210 includes amplifier transistor 212 and cascode transistor 214. Slab inductor 216 is coupled to cascode transistor 214 and operates as a radio frequency (RF) choke. In operation, driver amplifier 210 receives an input signal on node 211 and drives output node 215. As shown in FIG. 2, the output of driver amplifier 210 is capacitively coupled to slab inductor 242 of the quadrature hybrid.

Carrier amplifier 220 includes amplifier transistor 222 and cascode transistor 224. Slab inductor 226 is coupled to cascode transistor 224 and operates as an RF choke. In operation, carrier amplifier 220 receives an input signal on node 241 from the quadrature hybrid, and drives output node 225. As shown in FIG. 2, the output of carrier amplifier 220 is coupled to slab inductor 250 of the impedance transformation circuit.

As shown in FIG. 2, cascode transistor 224 is self-biased using resistor 227 and capacitor 228. This R-C biasing scheme raises the voltage at the gate of cascode transistor 224 for large output signal swings, and enables high voltage swings at the output of the carrier amplifier 220 without the risk of gate-drain breakdown. This allows for the use of thin gate transistors, thus increasing $f_t$ and $f_{max}$.... Further, the output voltage is divided almost equally between the two stacked transistors, thus reducing hot carriers effect on the reliability of the PA, even for large output signal swings.

Peak amplifier 230 includes amplifier transistor 232 and cascode transistor 234. Slab inductor 236 is coupled to cascode transistor 234 and operates as an RF choke. In operation, peak amplifier 230 receives an input signal on node 243 from the quadrature hybrid, and drives output node 235. Cascode transistor 234 receives a bias voltage $V_b$.

Slab inductor 250 and capacitors 251 and 252 form an impedance transformation circuit such as impedance transformation circuit 140 (FIG. 1). Further, slab inductor 260 and capacitors 261 and 262 from an output matching circuit such as output matching circuit 150 (FIG. 1). The impedance transformation circuit, quadrature hybrid, and output matching circuit are implemented using lumped elements to approximate transmission line operation. To save die area, coupled inductors may be used wherever possible. For example, the use of coupled inductors is straight forward in the quadrature hybrid; however, the use of coupled inductors may be more difficult for the impedance transformation circuit and output matching circuit because of layout constraints. The width of the metal used for all slab inductors may be large. For example, in some embodiments, the width of slab inductors may be on the order of 20~40μm. The skin effect reduces the benefit of the large width on the quality factor of the inductors, and therefore, increases the insertion loss within the PA and reduces its efficiency. In some embodiments, stripped metal traces may be used to implement the slab inductors.

Embodiments represented by FIG. 2 may be completely integrated on silicon as lumped elements structures are used to approximate, in a narrow-band sense, the behavior of the quadrature hybrid, impedance transformation circuit, and output matching circuit. Power matching between the quadrature hybrid and each amplifier is achieved through inductors 223 ($L_{cm}$) and 233 ($L_{pm}$). These inductors resonate with the capacitive input of the respective power amplifier at the frequency of operation. The differential circuit implementation of the carrier amplifier is shown in FIG. 3, and the differential circuit implementation of the peak amplifier is shown in FIG. 4.

Figure 3:
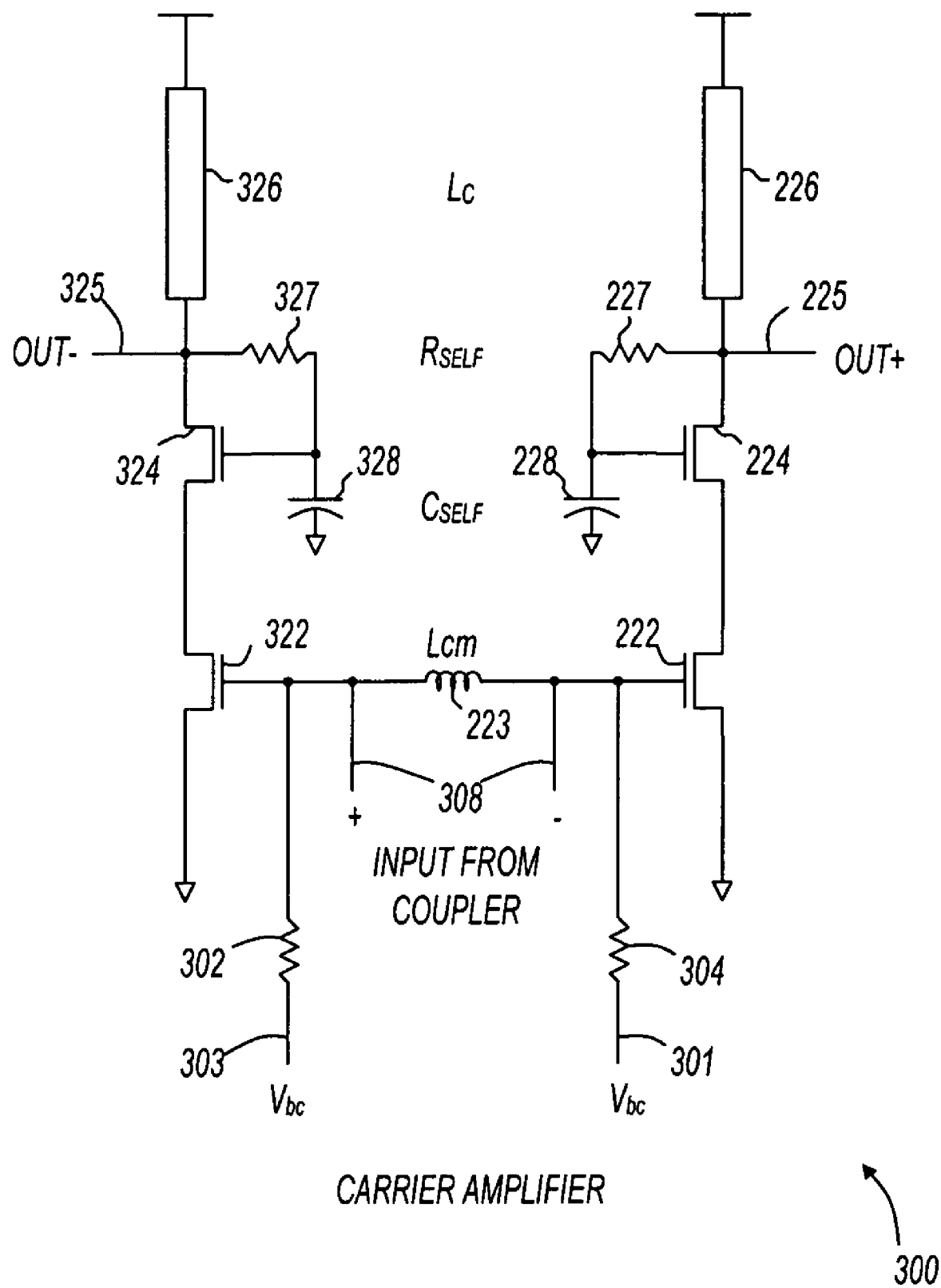
FIGS. 3 and 4 show schematics of amplifier circuits.
Figure 4:
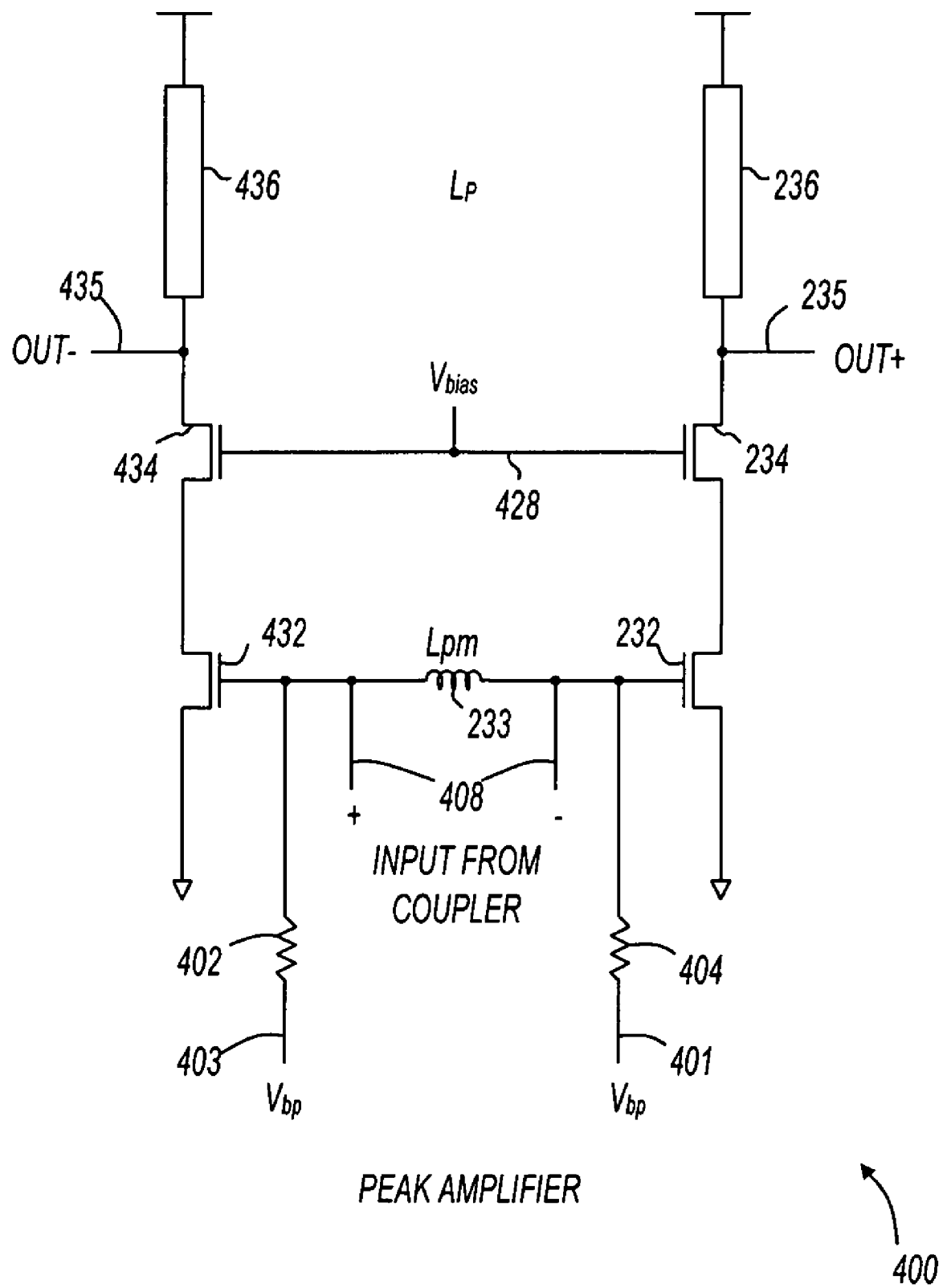

FIG. 3 shows a schematic of an amplifier circuit. Amplifier circuit 300 represents an amplifier that may be utilized as a differential carrier amplifier. Amplifier circuit 300 includes amplifier transistors 222 and 322, cascode transistors 224 and 324, slab inductors 226 and 326, capacitors 228 and 328, resistors 227 and 327, and resistors 302 and 304.

In operation, amplifier transistors 222 and 322 are biased by bias voltage Vbc, and cascode transistors are self-biased as described above with reference to carrier amplifier 220 (FIG. 2). A differential input voltage is received on input nodes 308, and a differential output signal is produced on output nodes 225 and 325. Cascode transistors 224 and 324 are coupled to provide increased output impedance, and slab inductors 226 and 326 are coupled as RF chokes and load devices. Amplifier transistors 222 and 322 receive a direct current (DC) bias voltage Vbc from nodes 301 and 303.

Amplifying transistors 222 and 322 exhibit a gate-to-source capacitance Cgs that depends on, among other things, the gate area of the transistor. Further, phase distortion introduced by the amplifier transistors is partially a function of the gate-to-source capacitance. In some embodiments, relative gate sizes are controlled in a carrier amplifier and a peak amplifier in order to reduce AM-to-PM distortion. The gate-to-source capacitance, and hence the phase characteristics of the amplifier may also change based on the value of the bias voltage Vb and input signal power.

Various embodiments of the present invention select values for Vb based on a desired phase characteristic. For example, a first amplifier circuit may be biased to have a particular phase characteristic as a function of increasing input power, and a second amplifier circuit may be biased to have a different phase characteristic as a function of increasing input power. Amplifiers such as amplifier circuit 300 can be coupled in parallel together to deliver increased power through power combining as shown in FIG. 1, and the phase characteristics of the parallel coupled amplifiers may be chosen so that the total AM-PM distortion is reduced.

FIG. 4 shows a schematic of an amplifier circuit. Amplifier circuit 400 represents an amplifier that may be utilized as a differential peak amplifier. Amplifier circuit 400 includes amplifier transistors 232 and 432, cascode transistors 234 and 434, slab inductors 236 and 436, and resistors 402 and 404.

In operation, amplifier transistors 232 and 432 are biased by bias voltage Vbc, and cascode transistors 234 and 434 are biased by voltage Vbias. A differential input voltage is received on input nodes 408, and a differential output signal is produced on output nodes 235 and 435. Cascode transistors 234 and 434 are coupled to provide increased output impedance, and slab inductors 236 and 436 are coupled as load devices and RF chokes. Bias voltage Vbias on node 428 may be set to provide a nominal gate voltage on cascode transistors 234 and 434. Amplifying transistors 232 and 432 receive a direct current (DC) bias voltage Vbp from nodes 401 and 403.

The size of transistors in the carrier amplifier (FIG. 3) and the peak amplifier (FIG. 4) can be chosen to reduce AM-PM distortion. Further, the DC operating point of each PA can be chosen such that it reduces the total AM-PM distortion. In general, the DC bias voltage (Vgs) of the carrier PA is higher than that of the peak PA. For large input signal swing, the average input capacitance seen at the input of each PA will vary in an opposite way. For the peak PA, it will increase, while for the carrier PA it will decrease. This will compensate the phase distortion of the PA at the output. Moreover, the carrier PA is operating in class AB to minimize the AM-AM distortion. In some embodiments, the gate area of the amplifying transistors in the peak amplifier is chosen to be larger than the gate area of the amplifying transistors in the carrier amplifier. For example, transistors may be sized to provide a ratio of peak amplifier input capacitance to carrier amplifier input capacitance of greater than 1.5. In some embodiments, the ratio is substantially 1.6.

Figure 5:
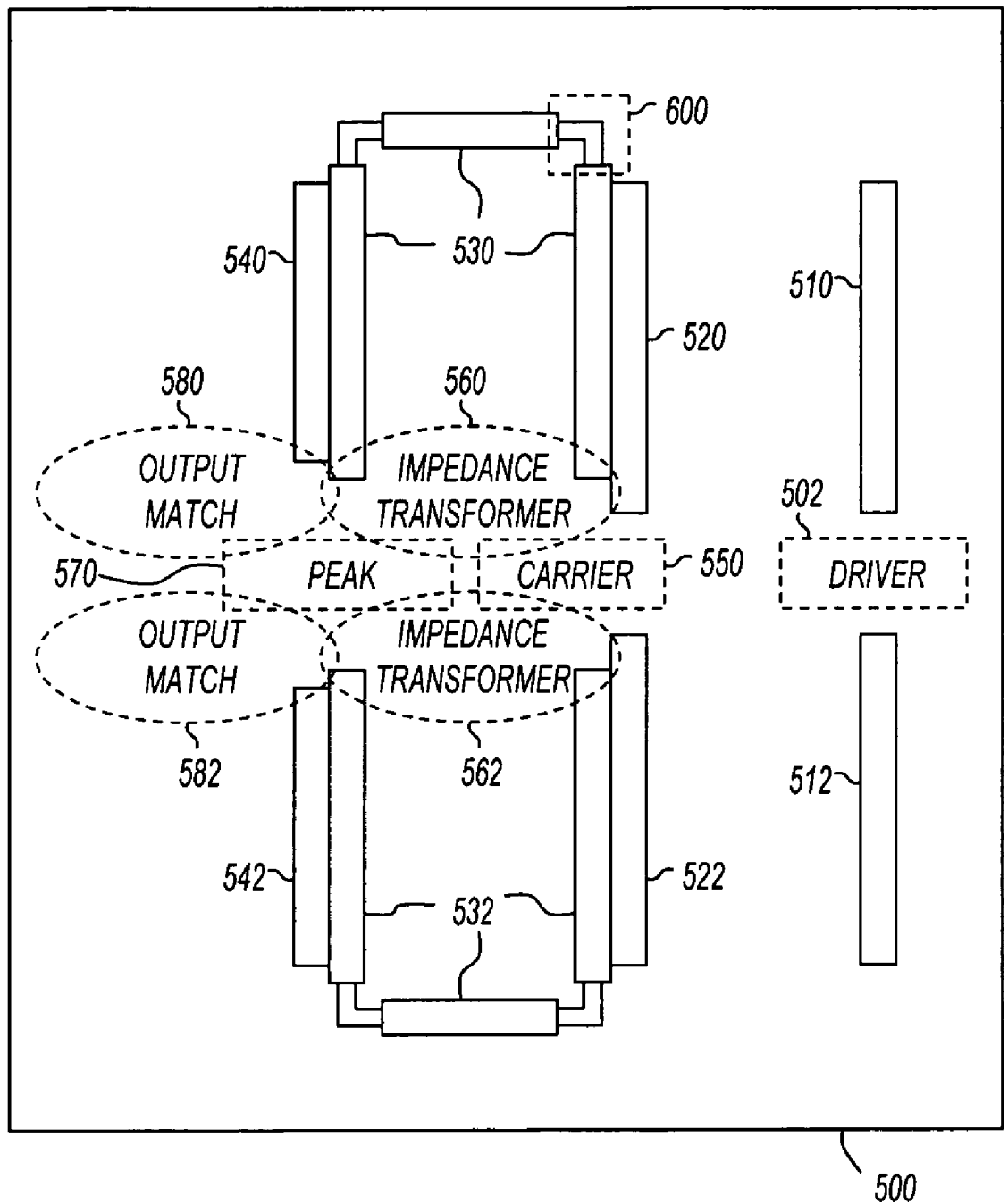
FIG. 5 shows an integrated circuit floorplan.

FIG. 5 shows an integrated circuit floorplan. Floorplan 500 shows all of the major components for a differential parallel power amplifier with slab inductors. Floorplan 500 shows driver amplifiers 502, carrier amplifiers 550, peak amplifiers 570, impedance transformation circuits 560 and 562, output matching circuits 580 and 582, slab inductors 510, 512, 520, 522, 540, and 542, and quadrature hybrids 530 and 532.

Slab inductors 510 and 512 are RF chokes and load devices for driver amplifiers 502. Slab inductors 520 and 522 are RF chokes and load devices for carrier amplifiers 550, and slab inductors 540 and 542 are RF chokes and load devices for peak amplifiers 570. Quadrature hybrids 530 and 532 are made up of coupled slab inductors and couple driver amplifiers 502 to carrier amplifiers 550 and peak amplifiers 570.

Figure 6:
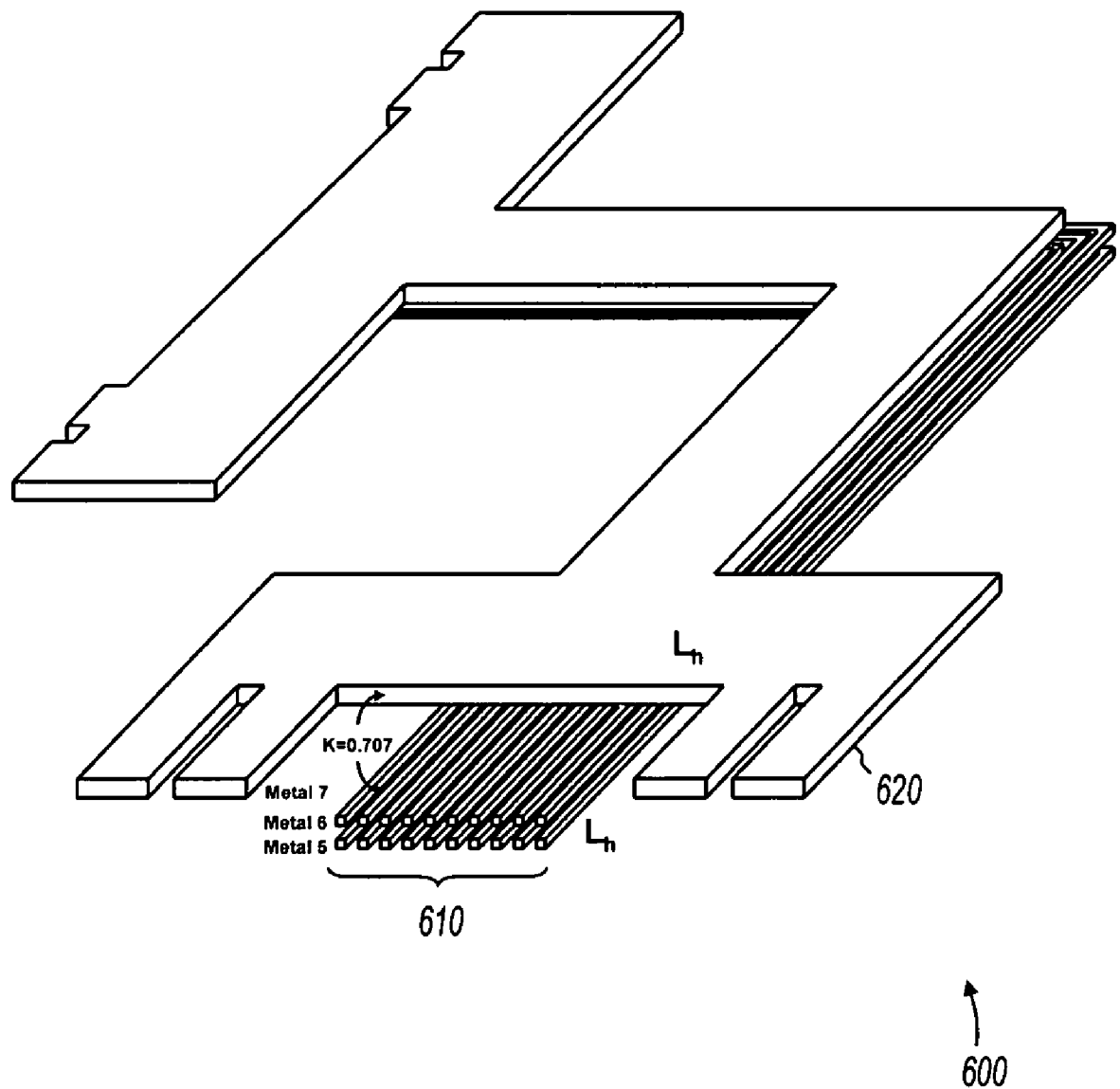
FIG. 6 shows a perspective view of a corner of two coupled slab inductors.

FIG. 6 shows a perspective view of a corner of two coupled slab inductors. View 600 shows a corner of quadrature hybrid 530 (FIG. 5). In embodiments represented by FIG. 6, slab inductor 620 is manufactured on one metal layer of an integrated circuit, and slab inductor 610 is manufactured on two metal layers of the integrated circuit. In addition, slab inductors 610 and 620 have dissimilar shapes. Slab inductor 610 includes multiple smaller strips on two layers, and slab inductor 620 includes fewer larger strips on a single layer. By providing dissimilar shapes on multiple layers, the various embodiments of the present invention may be implemented in different types of integrated circuits. For example, the slab inductors shown in FIG. 6 may be implemented in a complementary metal oxide semiconductor (CMOS) process originally designed for digital circuits.

Figure 7:
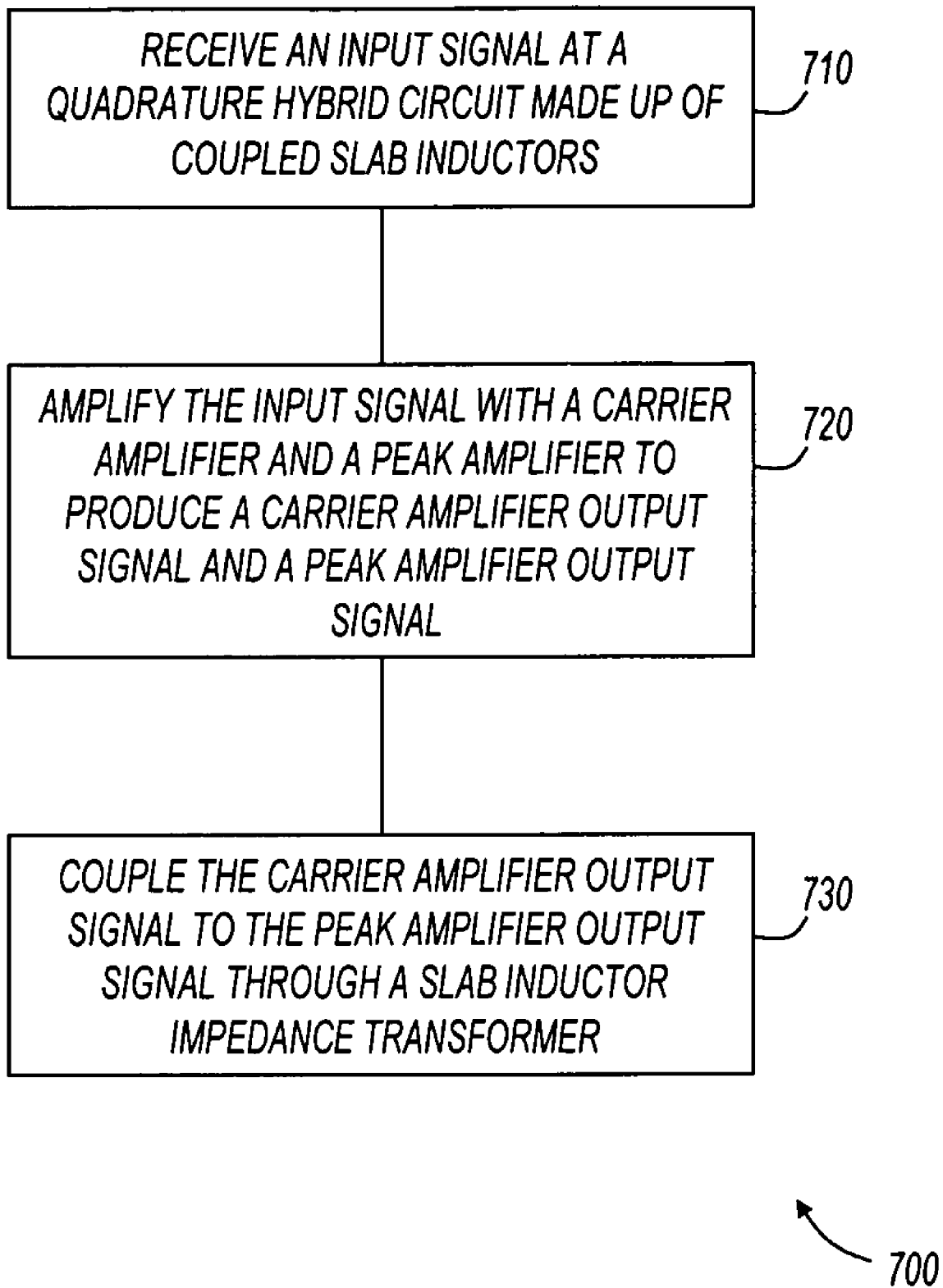
FIG. 7 shows a flowchart in accordance with various embodiments of the present invention.

FIG. 7 shows a flowchart in accordance with various embodiments of the present invention. In some embodiments, method 700, or portions thereof, is performed by an amplifier circuit, embodiments of which are shown in previous figures. In other embodiments, method 700 is performed by an integrated circuit or an electronic system. Method 700 is not limited by the particular type of apparatus performing the method. The various actions in method 700 may be performed in the order presented, or may be performed in a different order. Further, in some embodiments, some actions listed in FIG. 7 are omitted from method 700.

Method 700 is shown beginning with block 710 in which an input signal is received at a quadrature hybrid circuit made up of coupled slab inductors. In some embodiments, this may correspond to amplifier 200 (FIG. 2) receiving an input signal at the quadrature hybrid made up of slab inductors 240 and 242. At 720, the input signal is amplified with a carrier amplifier and a peak amplifier to produce a carrier amplifier output signal and a peak amplifier output signal. At 730, the carrier amplifier output signal is coupled to the peak amplifier output signal through a slab inductor impedance transformer. In some embodiments, this corresponds to the operation of the impedance transformation circuit made up of slab inductor 250 and capacitors 251 and 252 (FIG. 2).

Figure 8:
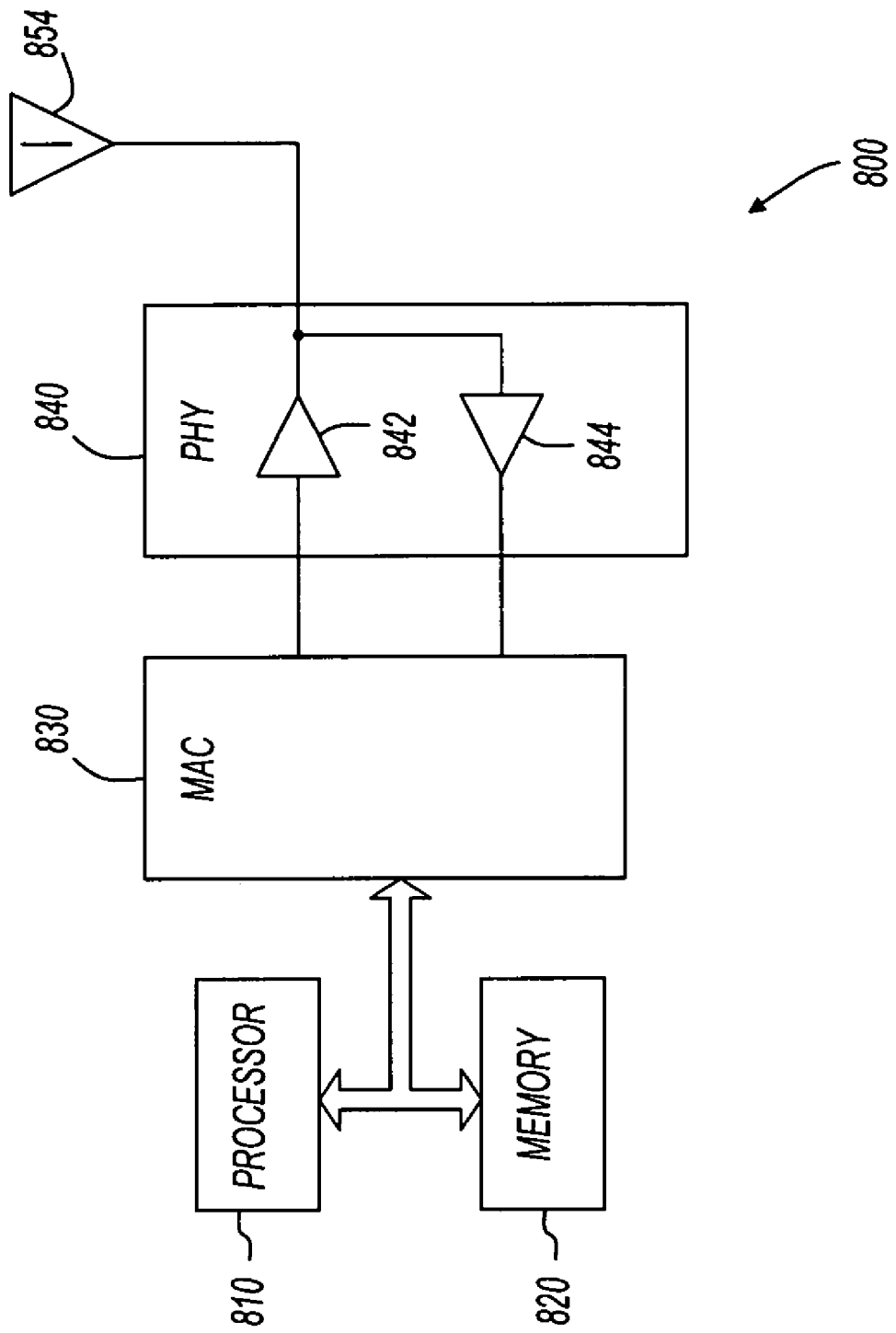
FIG. 8 shows a diagram of an electronic system in accordance with various embodiments of the present invention.

FIG. 8 shows a system diagram in accordance with various embodiments of the present invention. Electronic system 800 includes antenna 854, physical layer (PHY) 840, media access control (MAC) layer 830, processor 810, and memory 820. In operation, system 800 sends and receives signals using antenna 854, and the signals are processed by the various elements shown in FIG. 8.

Antenna 854 may include one or more antennas. For example, antenna 854 may include a single directional antenna or an omni-directional antenna. As used herein, the term omni-directional antenna refers to any antenna having a substantially uniform pattern in at least one plane. For example, in some embodiments, antenna 854 may include a single omni-directional antenna such as a dipole antenna, or a quarter wave antenna. Also for example, in some embodiments, antenna 854 may include a single directional antenna such as a parabolic dish antenna or a Yagi antenna. In still further embodiments, antenna 854 may include multiple physical antennas. For example, in some embodiments, multiple antennas are utilized for multiple-input-multiple-output (MIMO) processing or spatial-division multiple access (SDMA) processing.

Physical layer (PHY) 840 is coupled to antenna 854 to interact with other wireless devices. PHY 840 may include circuitry to support the transmission and reception of radio frequency (RF) signals. For example, as shown in FIG. 8, PHY 840 includes power amplifier (PA) 842 and low noise amplifier (LNA) 844. Power amplifier 842 may include a amplifier such as those described above with reference to FIGS. 1-5. In some embodiments, PHY 840 includes additional functional blocks to perform filtering, frequency conversion or the like.

PHY 840 may be adapted to transmit/receive and modulate/demodulate signals of various formats and at various frequencies. For example, PHY 840 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 8 include cellular phones, personal digital assistants, wireless local area network interfaces, wireless wide area network stations and subscriber units, and the like. Many other systems uses for power amplifiers exist. For example, PA 842 may be used in a desktop computer, a network bridge or router, or any other system without an antenna.

Media access control (MAC) layer 830 may be any suitable media access control layer implementation. For example, MAC 830 may be implemented in software, or hardware or any combination thereof. In some embodiments, a portion of MAC 830 may be implemented in hardware, and a portion may be implemented in software that is executed by processor 810. Further, MAC 830 may include a processor separate from processor 810.

Processor 810 may be any type of processor capable of communicating with memory 820, MAC 830, and other functional blocks (not shown). For example, processor 810 may be a microprocessor, digital signal processor (DSP), microcontroller, or the like.

Memory 820 represents an article that includes a machine readable medium. For example, memory 820 represents a random access memory (RAM), dynamic random access memory (DRAM), static random access memory (SRAM), read only memory (ROM), flash memory, or any other type of article that includes a medium readable by processor 810. Memory 820 may store instructions for performing software driven tasks. Memory 820 may also store data associated with the operation of system 800.

Although the various elements of system 800 are shown separate in FIG. 8, embodiments exist that combine the circuitry of processor 810, memory 820, MAC 830, and all or a portion of PHY 840 in a single integrated circuit. For example, MAC 830 and PA 842 may be combined together on an integrated circuit die. In some embodiments, the various elements of system 800 may be separately packaged and mounted on a common circuit board. In other embodiments, the various elements are separate integrated circuit dice packaged together, such as in a multi-chip module, and in still further embodiments, various elements are on the same integrated circuit die.

Parallel amplifier circuits, quadrature hybrids, slab inductors, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of amplifier circuit 200 (FIG. 2) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A power amplifier circuit comprising:
   a first transistor amplifier having an input node and an output node;
   a second transistor amplifier having an input node and an output node; and
   first and second slab inductors formed on an integrated circuit with the first and second transistor amplifiers, the first and second slab inductors coupled to the input nodes of the first and second transistor amplifiers to form a quadrature hybrid;
   wherein the first and second slab inductors are formed on one metal layer of the integrated circuit.

2. The power amplifier circuit of claim 1 wherein the first transistor amplifier is biased as a carrier amplifier and the second transistor amplifier is biased as a peak amplifier.

3. The power amplifier circuit of claim 2 further comprising a radio frequency (RF) choke slab inductor coupled to the first transistor amplifier.

4. The power amplifier circuit of claim 2 further comprising an impedance transformer slab inductor having a first end coupled to the output node of the first transistor amplifier.

5. The power amplifier circuit of claim 4 wherein the impedance transformer slab inductor includes a second end coupled to the output node of the second transistor amplifier.

6. A power amplifier circuit comprising:
   a first transistor amplifier having an input node and an output node;
   a second transistor amplifier having an input node and an output node; and
   first and second slab inductors formed on an integrated circuit with the first and second transistor amplifiers, the first and second slab inductors coupled to the input nodes of the first and second transistor amplifiers to form a quadrature hybrid;
   wherein the first and second slab inductors are formed on two separate metal layers of the integrated circuit.

7. The power amplifier circuit of claim 6 wherein the first and second slab inductors have dissimilar shapes.

8. A power amplifier circuit comprising:
   a first transistor amplifier having an input node and an output node;
   a second transistor amplifier having an input node and an output node; and
   first and second slab inductors formed on an integrated circuit with the first and second transistor amplifiers, the first and second slab inductors coupled to the input nodes of the first and second transistor amplifiers to form a quadrature hybrid;
   wherein the first slab inductor is formed on a first metal layer, and the second slab inductor is formed on both a second and third metal layers.

9. The power amplifier circuit of claim 8 wherein the first slab inductor is formed above the second slab inductor.

10. An integrated circuit comprising:
    first and second slab inductors forming a quadrature hybrid circuit;
    a Doherty amplifier having a carrier amplifier and a peak amplifier coupled to the quadrature hybrid circuit;
    a third slab inductor coupled as an impedance transformer between output nodes of the carrier amplifier and peak amplifier; and
    a fourth slab inductor coupled as part of an output matching network coupled to the output node of the peak amplifier;
    wherein the carrier amplifier comprises a first NMOS transistor.

11. The integrated circuit of claim 10 wherein the carrier amplifier further comprises a self-biased cascode transistor.

12. The integrated circuit of claim 11 further comprising a fifth slab inductor coupled to the cascode transistor as a radio frequency (RF) choke.

13. The integrated circuit of claim 10 wherein the peak amplifier comprises a second NMOS transistor.

14. The integrated circuit of claim 13 wherein the first and second NMOS transistors are sized to provide a ratio of peak amplifier input capacitance to carrier amplifier input capacitance of greater than 1.5.

15. A method comprising:
receiving an input signal at a quadrature hybrid circuit made up of coupled slab inductors;
amplifying the input signal with a carrier amplifier and a peak amplifier to produce a carrier amplifier output signal and a peak amplifier output signal; and
coupling the carrier amplifier output signal to the peak amplifier output signal through a slab inductor impedance transformer;
wherein receiving an input signal at a quadrature hybrid comprises receiving the input signal at a first end of a first slab inductor on a first metal layer of an integrated circuit, and
coupling the input signal to a second slab inductor on a second metal layer of the integrated circuit.

16. The method of claim 15 further comprising providing an output signal through an output matching slab inductor.

17. A system comprising:
an omni-directional antenna; and
a power amplifier circuit coupled to drive a signal on the antenna, the power amplifier circuit comprising a first transistor amplifier having an input node and an output node, a second transistor amplifier having an input node and an output node, and first and second slab inductors formed on an integrated circuit with the first and second transistor amplifiers, the first and second slab inductors coupled to the input nodes of the first and second transistor amplifiers to form a quadrature hybrid;
wherein the first and second slab inductors are formed on two separate metal layers of the integrated circuit.

18. The system of claim 17 wherein the first and second slab inductors have dissimilar shapes.

* * * * *